(12) United States Patent
Colburn et al.

(10) Patent No.: US 8,721,952 B2
(45) Date of Patent: May 13, 2014

(54) PNEUMATIC METHOD AND APPARATUS FOR NANO IMPRINT LITHOGRAPHY HAVING A CONFORMING MASK

(75) Inventors: Matthew E. Colburn, Hopewell Junction, NY (US); Yves C. Martin, Ossining, NY (US); Theodore G. van Kessel, Millbrook, NY (US); Hematha K. Wickramasinghe, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1531 days.

(21) Appl. No.: 10/989,078

(22) Filed: Nov. 16, 2004

(65) Prior Publication Data

US 2006/0105571 A1 May 18, 2006

(51) Int. Cl.
*B29C 59/02* (2006.01)

(52) U.S. Cl.
USPC ............. 264/314; 264/85; 264/495; 264/496; 264/313; 264/293

(58) Field of Classification Search
USPC ............ 977/887; 264/313, 314, 293, 379, 85, 264/495, 496; 101/379
See application file for complete search history.

(56) References Cited

U.S. PATENT DOCUMENTS

| 2,124,711 | A | * | 7/1938 | Rowell | 101/41 |
|---|---|---|---|---|---|
| 3,521,955 | A | * | 7/1970 | Tancredi | 355/85 |
| 4,786,358 | A | * | 11/1988 | Yamazaki et al. | 216/48 |
| 6,696,220 | B2 | * | 2/2004 | Bailey et al. | 425/385 |
| 2002/0132482 | A1 | * | 9/2002 | Chou | 438/692 |
| 2003/0189273 | A1 | * | 10/2003 | Olsson | 264/293 |
| 2005/0072755 | A1 | * | 4/2005 | McMackin et al. | 216/44 |
| 2005/0146078 | A1 | * | 7/2005 | Chou et al. | 264/293 |
| 2006/0062922 | A1 | * | 3/2006 | Xu et al. | 427/372.2 |

OTHER PUBLICATIONS

Choi, W.M. and O.O. Park, A soft-imprint technique for direct fabrication of submicron scale patterns using a surface-modified PDMS mold, Microelectronic Engineering, vol. 70 (Aug. 27, 2003) pp. 131-136.*

* cited by examiner

*Primary Examiner* — Matthew Daniels
*Assistant Examiner* — Saeed Huda
(74) *Attorney, Agent, or Firm* — Daniel P. Morris; McGinn IP Law Group, PLLC

(57) ABSTRACT

A method (and apparatus) for nano lithography, includes applying a pneumatic pressure to at least one of a surface of a semi-rigid mask or template and a portion of a surface of a resist-coated workpiece, and, by the applying of the pneumatic pressure, transferring a pattern from the mask to the workpiece.

19 Claims, 4 Drawing Sheets

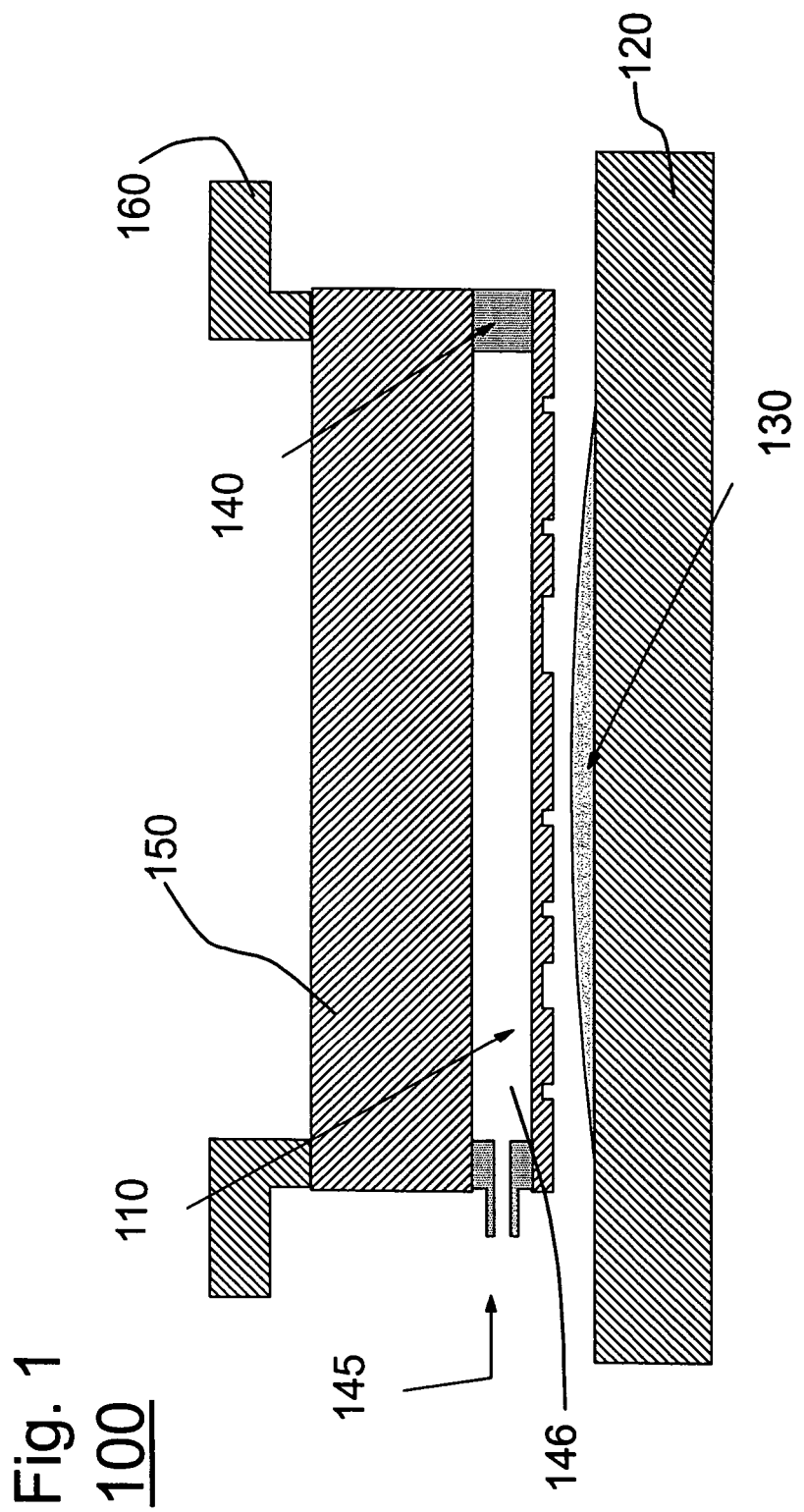

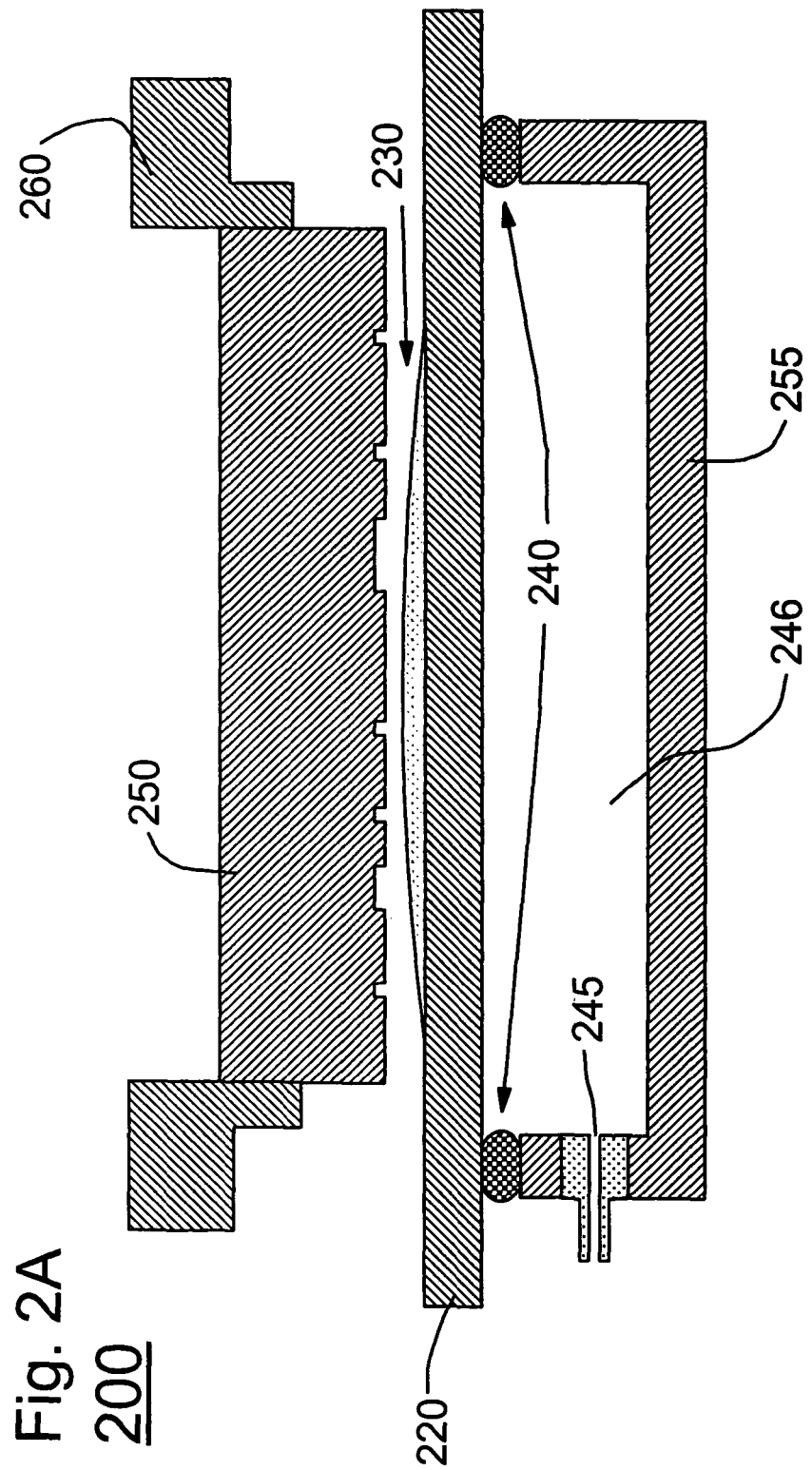

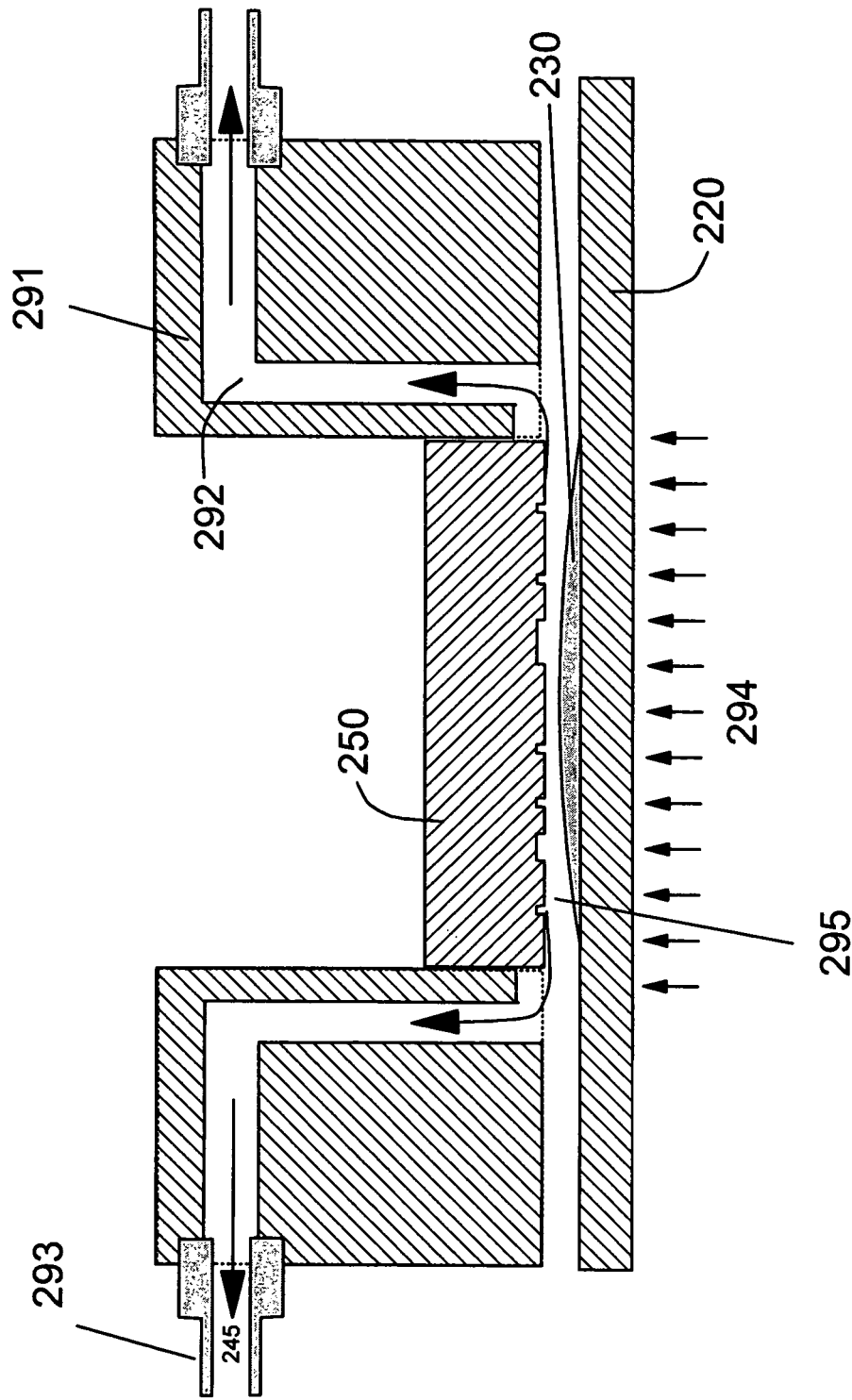

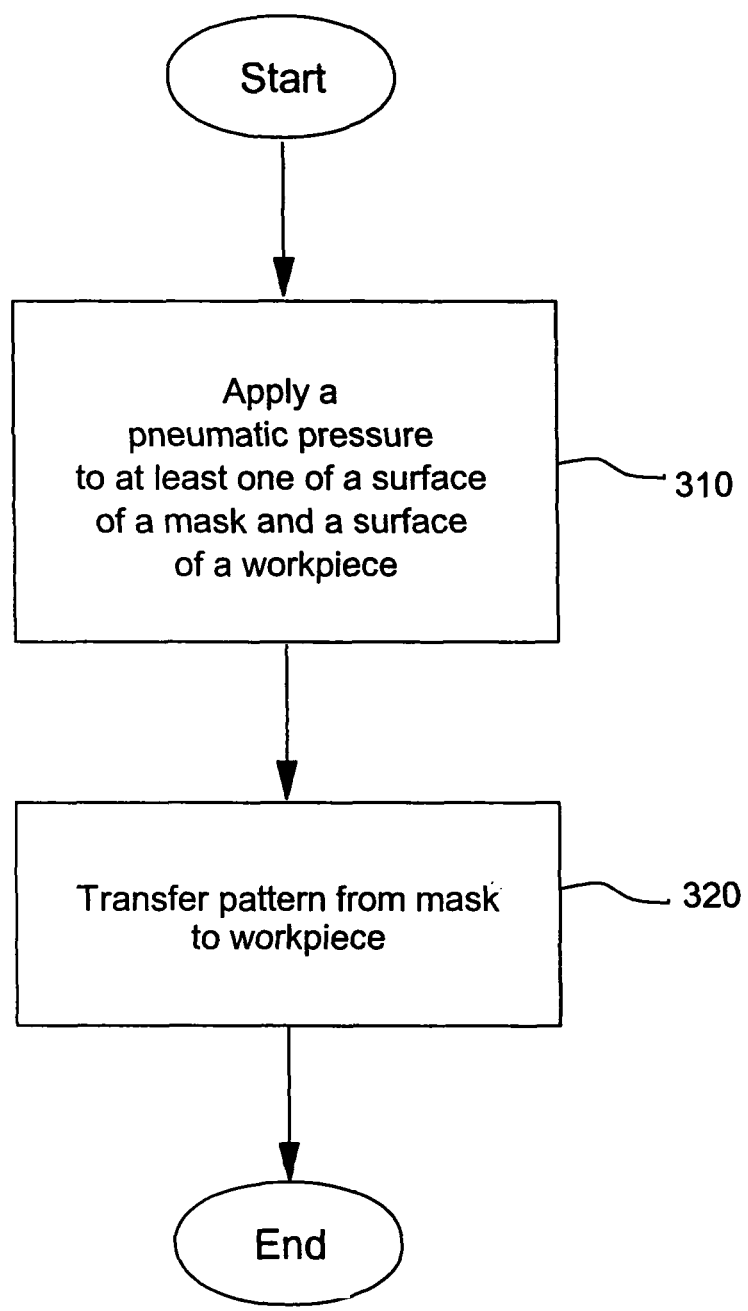

PNEUMATIC METHOD AND APPARATUS FOR NANO IMPRINT LITHOGRAPHY HAVING A CONFORMING MASK

BACKGROUND OF THE INVENTION

1. Field of the Invention

The present invention generally relates to a method and apparatus for nano imprint lithography, and more particularly to a pneumatic method and apparatus for nano imprint lithography.

2. Description of the Related Art

The process of imprint lithography involves pressing a template (or mold or mask) against a polymer or photoresist-coated workpiece, curing the polymer and removing the template from the workpiece leaving behind an impression of the template in the cured polymer coating. The deformation of the template and/or workpiece under applied mechanical pressure is a problem when the features of the template are of very small (e.g., nanometer) dimensions and for which it is desirable to maintain long range dimensional tolerances on this scale.

Additionally, imperfections with respect to flatness (e.g., uniform thickness) of either the template or workpiece impose further constraints to printing nanometer-scale features.

The conventional methods and apparatus have used a rigid, thick glass or quartz template rigidly clamped (or glued rigidly) to a frame.

Finally, it is desirable to use a template that is a fraction of the dimension of the workpiece or substrate in order to meet alignment and template fabrication needs relating to nano scale lithography. Thus, the template is applied sequentially or stepped across the substrate to fill the substrate with patterns.

Thus, imprint lithography typically transfers a pattern from a thick block of quartz to a generally thinner workpiece, like a silicon wafer. However, as alluded to above, when performing imprint lithography, one attempts (ideally) to squeeze a liquid photoresist to an infinitely thin layer except for the feature(s) etched in the mask. Silicon wafers with "real world" chips (particularly after they have been processed) have some topography (e.g., hills and valleys on a long scale), and the chips may be slightly warped, etc. Thus, the silicon wafers typically are not perfectly flat. This is problematic.

Prior to the present invention, there has been no attempt to solve such a problem by using a transparent quartz template pressed in place against a workpiece using pneumatic pressure.

More specifically, there has been no apparatus or method in which pneumatic pressure is uniformly applied against either (or both) the quartz template and the workpiece to achieve uniform compression of the photoresist.

Hence, such methods have not been able to retain the essential transparent properties of the quartz template while applying uniform pressure to a conformal membrane, thereby allowing the compensation for planarity defects in both template and workpiece.

Other conventional methods have used a template made out of a flexible polymer material for the purpose of providing mechanical conformity between template and workpiece. Still other conventional methods have used a rigid quartz template, covered with a layer of soft polymer material. These methods have several major drawbacks, including that dimensional integrity in the plane of the template is not sufficiently preserved. Additionally, the motion of the polymer material due to non-uniform pressure or due to small temperature gradients generate distortions to the printed patterns that prohibit their use in microelectronic lithography.

While thermal curing is an option, there has been no conventional method which has adequately addressed the case (and the attendant problems) where the polymer is cured by exposure to ultraviolet light (UV). Additionally, ultraviolet (UV) transparency is severely degraded by the polymer material. Further, exposure to UV radiation degrades the polymer material over time.

SUMMARY OF THE INVENTION

In view of the foregoing and other exemplary problems, drawbacks, and disadvantages of the conventional methods and structures, an exemplary feature of the present invention is to provide a method and structure in which pneumatic pressure is uniformly applied against either (or both) a semi-rigid template and a workpiece to achieve uniform compression of a photoresist.

Another feature is to provide a method and apparatus for retaining the essential transparent properties of a template (e.g., a quartz template), while applying uniform pressure to a conformal membrane, thereby allowing compensation for planarity defects in both template and workpiece.

Another feature is to retain a high degree of fidelity in the dimensions of the printed pattern, owing to the rigid properties of the template (e.g., a quartz template) and workpiece in the pattern plane (or X-Y, or horizontal plane). In the invention, preferably the template is a rigid material such as quartz, but is thin enough to have a slight flexibility in the surface normal dimension. In typical cases, this flexibility is on the order of microns.

In a first exemplary aspect of the present invention, a method (and apparatus) for nano lithography, includes applying a pneumatic pressure to at least one of a surface of a semi-rigid mask or template and a portion of a surface of a resist-coated workpiece, and, by the applying of the pneumatic pressure, pressing a liquid or gelatinous polymer between the template and the workpiece, curing the polymer and thereby transferring a pattern from the mask to the workpiece.

In a second exemplary embodiment of the present invention, a method of uniformly applying a force to a surface of a mask for nano-lithography, includes applying a force to a surface of a mask to uniformly transfer a pattern formed on the mask, to a surface of the workpiece formed adjacent to the mask, wherein one of the mask and the workpiece is conformal.

In a third exemplary embodiment of the present invention, an apparatus for nano lithography, includes a mask having a pattern formed thereon, and a pneumatic pressure driving source for applying a pneumatic pressure to at least one of a surface of the mask and a surface of a workpiece, thereby to uniformly transfer the pattern from the mask to the workpiece.

In a fourth exemplary embodiment of the present invention, an apparatus for nano lithography, includes a mask having a pattern formed thereon, and a unit for applying a pneumatic pressure to at least one of a surface of a mask and a surface of a workpiece, to transfer the pattern from the mask to the workpiece.

With the unique and unobvious aspects of the invention, uniform pneumatic pressure can be applied against either or both the template and the work piece to achieve uniform compression of the photoresist.

Hence, a template with a high degree of flatness such as a rigid thick quartz mask, as well as a workpiece with a high degree of flatness (such as a silicon wafer on a rigid holder (or chuck), both with a very high degree of flatness and cleanliness of all surfaces) are not required. These requirements in mechanical tolerances would otherwise be very expensive to manage and to retain. Rather, either the template or the workpiece is given a small degree of flexibility to accommodate small bendings (e.g., typically in the sub-micron range) over large dimensions (e.g., typically on the scale of a centimeter), i.e., it is still stiff but somewhat conformal. Pneumatic pressure applied to the back side of the template and/or the workpiece presses them together with a high degree of conformality.

Hence, a rigid thick quartz mask rigidly clamped or glued rigidly to a frame, as in the conventional methods, is not required. The template can be held in place until pressed by vacuum. Instead, the invention provides the mask with a degree of conformality (e.g., the mask is still stiff but somewhat conformal, and then pressurizes the mask from the back side thereof, such that the mask can be pressed against the wafer (or vice versa) and get the mask to conform to the wafer. Simplistically, the inventive technique can be analogized to an inner tube of a tire which, when pressurized, conforms to the inside of the tire wall (if the inner tube could be made out of aluminum foil, for example).

The reason that the conformality is important is that, in imprint lithography, everything is exposed (e.g., with ultraviolet rays, etc.), such that the resist in the channels in the mask will harden, as well as any photoresist between the unpatterned portions of the mask and the surface. This latter portion of resist, called the resistual layer, must be kept as thin as possible, and on the order of the smallest printed pattern dimension (e.g., approximately 50 nanometers in today's apparatus). In the present art of imprint patterning, an otherwise thick residual layer distorts the next lithographic process which transfers the pattern in the resist into actual features (e.g., such as metal lines or semiconducting regions) in the silicon wafer.

Other advantages of the present invention include that expensive mechanical tolerances can be avoided in obtaining flatness of all surfaces.

Further, high dimensional fidelity can be maintained in the lateral directions (in the plane of the pattern).

Additionally, the invention provides the ability to imprint over pre-patterned, non-flat wafers.

BRIEF DESCRIPTION OF THE DRAWINGS

The foregoing and other exemplary purposes, aspects and advantages will be better understood from the following detailed description of exemplary embodiments of the invention with reference to the drawings, in which:

FIG. 1 illustrates a pneumatic membrane imprint lithography apparatus 100 according to the present invention;

FIG. 2A illustrates a pneumatic membrane imprint lithography apparatus 200 according to a second embodiment of the present invention;

FIG. 2B illustrates a pneumatic membrane imprint lithography apparatus 290 according to a third embodiment of the present invention using partial vacuum and atmospheric pressure; and FIG. 3 illustrates a method 300 of nano imprint lithography according to the present invention.

DETAILED DESCRIPTION OF EXEMPLARY EMBODIMENTS OF THE INVENTION

Referring now to the drawings, and more particularly to FIGS. 1-3, there are shown exemplary embodiments of the method and structures according to the present invention.

Exemplary Embodiment

As mentioned above, imprint lithography refers to a process where a template or mold containing a pattern is pressed against a workpiece with a layer of intervening photoresist. As the photoresist is compressed between the template and the workpiece, the photoresist spreads out and fills the space between the template and the workpiece and the patterned voids in the template.

At the desired distance between template and workpiece, the photoresist is cured by exposure to UV light through the transparent template. Once the resist is cured, the template is removed, thereby leaving behind the template pattern in the cured photoresist covering the workpiece. Thus, the template pattern has been transferred to the workpiece.

During the compression phase of this process, it is critical to avoid distortions of both the template and workpiece.

To achieve the printing of nanometer-scale features, the template should have uniform pressure. As mentioned above, this is typically resolved using thick quartz to disperse the mechanical pressure applied to hard point mounts. Departure from perfect flatness in either the template or workpiece further compounds the problem of transferring small features across the field.

Turning now to FIG. 1, the present invention resolves the above and other problems of the conventional methods by providing an apparatus 100 which uses a thin transparent membrane 110 as the lithographic pattern template.

The membrane 110 is preferably patterned on one side, and is preferably thin enough to be flexible on a desired dimension scale. For example, the membrane 110 may have a thickness within a range of about 50 microns to about 500 microns which is useful in quartz. Different stiffness values can be achieved by varying this parameter. It is noted that the mask can be made of materials other than quartz such as, for example, sapphire. The essential quality is that the mask be hard, rigid and thinned to the point where it is flexible on the order of microns in the normal direction.

The membrane 110 is preferably formed of a material chosen to be transparent to the radiation (e.g., actinic wavelengths) necessary to expose/activate the photoresist 130, but also, generally, transparent to visible wavelengths so that optical alignment can be performed of the pattern on the mask with the underlying workpiece 120. That is, the user should be able to optically image through the mask/membrane 110 in the alignment process.

The membrane 110 may be held by a pressure seal 140 preferably formed of viton or similar material.

The pressure seal 140 includes an air pressure inlet 145 for receiving an air pressure from a pneumatic pressure source. Instead of air, any gas may be used such as nitrogen, helium or the like. The inlet may have a diameter within a range of millimeters.

As shown, the membrane 110 is mounted to a transparent rigid window 150, and forms a predetermined gap 146 between a lower surface of the window 150 and the upper surface of the membrane 110. The window is preferably optically perfect (i.e., surface roughness on the order of preferably no more than about 30 nm) and preferably is formed of flat quartz material or the like.

The gap 146 preferably has a thickness in excess of dimensions that would cause optical fringes (e.g., a millimeter or so) but as would be evident the thickness of the gap depends upon the designer's constraints and requirements such as the composition (e.g., material and thickness) of the membrane and the amount of pressure being input to the gap to make the membrane conformal. The gap should be large enough so that etalon fringes and the like are avoided.

The window 150 is coupled (e.g., fastened) to a mounting flange 160 of a positioning mechanism (not shown). By virtue of the window 150 being transparent to the curing wavelength, one can still image through the transparent window, and still get radiation therethrough and through the membrane 110 to image and form the pattern onto the workpiece 120.

The membrane/template 110 is positioned over the desired location on a workpiece 120, lowered mechanically to close proximity to the work piece (or light contact therewith) and pneumatic pressure is applied against the back side (e.g., in FIG. 1, the surface of the membrane opposing the lower surface of the transparent rigid window 150) of the membrane/template 110 causing it to be pressed into a photoresist 130 uniformly. Small variations in the flatness of the workpiece 120 are compensated by the flexure of the membrane 110, thereby resulting in a uniform application of the membrane/template 110. When the workpiece 120 itself is compliant (e.g., a thin silicon wafer), this strategy can compensate for compliance of the workpiece 120 with respect to a positioning chuck (not shown in FIG. 1).

In operation, the apparatus 100 of FIG. 1 picks up a mask/membrane 110, and moves the mask/membrane 110 over the workpiece. Then, the mask/membrane 110 is mechanically lowered against the workpiece 120 as pneumatic pressure is applied to the membrane 110. Alternatively, the workpiece 120 could be raised against the membrane 110 while pneumatic pressure is applied.

Hence, the inventive method uniformly applies pneumatic pressure against either (or both) the template 110 and the workpiece 120 to achieve uniform compression of the photoresist 130.

For example, FIG. 2A illustrates a pneumatic membrane imprint lithography apparatus 200 according to a second embodiment of the present invention, in which pressure is applied to the backside of a flexible workpiece 220 (e.g., a silicon wafer). The workpiece has a photoresist 230 formed thereon.

The apparatus 200 uses a transparent window 250 with an etch pattern (mold) thereon as the lithographic pattern template. The transparent window is mounted to a mounting flange 260, and is opposed to the flexible workpiece 220.

The window 250 is preferably formed of a material chosen to be transparent to the radiation (e.g., actinic wavelengths) necessary to expose/activate the photoresist 230, but also, generally, transparent to visible wavelengths so that optical alignment can be performed of the pattern on the mask with the underlying workpiece 220. That is, the user should be able to look (image) through the window 250 in the alignment process.

The workpiece 220 may be held (or contacted) by a rubber seal 240 (or flexible skirt or small gap).

The rubber seal 240 is coupled to a housing structure 255 which includes an air pressure inlet 245 for receiving an air pressure from a pneumatic pressure source. Instead of air, as in the first embodiment, any gas may be used such as nitrogen, helium or the like. The inlet may have a diameter that is small, since the amount of gas flow is small.

As shown, the structure of the rubber seal 240/housing 255 forms a predetermined gap 246 which is formed between a lower surface of the workpiece 220 and the interior surface of the housing 255.

As before, the window 250 is preferably optically perfect and preferably is formed of flat quartz material or the like.

The gap 246 preferably has a thickness within millimeter range but as would be evident the thickness of the gap depends upon the designer's constraints and requirements such as the composition (e.g., material and thickness) of the membrane and the amount of pressure being input to the gap to make the membrane conformal.

The template 250 is coupled (e.g., fastened) to a mounting flange 260 of a positioning mechanism (not shown). By virtue of the window 250 being transparent to the curing wavelength, one can still image through the transparent window, and still get radiation therethrough and to image and form the pattern onto the workpiece 220.

Both upper and lower portions of the apparatus shown in FIG. 2A are positioned at the desired location on a workpiece 220, brought into contact with the workpiece and pneumatic pressure is applied against the back side of the workpiece 220 (e.g., in FIG. 2A, the surface of the workpiece opposite the surface of the workpiece which has the photoresist 230 on it), causing the window 250 to apply the pattern to the photoresist 230 uniformly. Small variations in the flatness of the workpiece 220 (or the window 250) are compensated by the flexure of the wafer 220, thereby resulting in a uniform application of the of the pattern to the photoresist 230. Thus, when the workpiece 220 is compliant (e.g., a thin silicon wafer), this strategy can compensate for compliance of the workpiece 220 with respect to a positioning chuck (not shown in FIG. 2A).

Thus, the membrane (e.g., in FIG. 1) and/or the workpiece (e.g., shown in FIG. 2A) may have a backside pressure applied thereto.

Additionally, FIG. 2B illustrates a pneumatic membrane imprint lithography apparatus 290 according to a third embodiment of the present invention using partial vacuum and atmospheric pressure.

Specifically, the apparatus 290 is somewhat similar to that shown in FIG. 2A, but includes a mounting flange 291 having air conduits 292 formed therein. The air conduits 292 are coupled to a vacuum connection 293 via an inlet 245. An atmospheric pressure 294 is applied against the backside of the flexible workpiece 220. A partial vacuum 295 exists between the window 250 and the photoresist 230.

It is noted that in all three exemplary cases, it is intended that the workpiece can be positioned relative to the template so as to be able to print multiple impressions of the template on the workpiece in different locations (i.e., print a stepped pattern such as chip patterns on a semiconductor wafer).

Turning to FIG. 3, a flowchart of the inventive method 300 of nano lithography is shown.

In step 310, a pneumatic pressure is applied to at least one of a surface of a mask and a surface of a workpiece.

Then, in step 320, by virtue of the pressure applied in step 310, a pattern is transferred from the mask to the workpiece.

Thus, in contrast to the conventional methods which use a rigid thick quartz mask rigidly clamped or glued rigidly to a frame, the inventive method retains the essential transparent properties of the quartz template while applying uniform pressure to a conformal membrane, thereby allowing compensation for planarity defects in both template and workpiece.

Further, in the inventive design, it is possible to image through the transparent window (e.g., for alignment etc.) and also to input the radiation therethrough, and thus the inventive design allows exposure of the resist and applying pressure to the resist at the same time.

It is noted that the invention can also be run in reverse such that the mask can be picked up by an under-vacuum. Thus, if the user desires to change masks, then the pressure can be reversed, and a new mask can be picked up.

It is also noted that the mask/membrane 110 is laterally confined by the inventive apparatus, such that the mask 110 can be picked up under vacuum pressure, moved over to the workpiece 120, lowered onto the workpiece, and then back pressure is applied to imprint the pattern onto the workpiece 120, and then to lift the mask up again, vacuum pressure is applied to pull the mask 110 off the workpiece 120.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A method of nano lithography, said method comprising:
    applying a photoresist to a frontside of a workpiece, the workpiece being held by a flexible seal against a housing structure, and the workpiece having a thickness and comprising a material so as to be flexible in a range of approximately microns in a direction perpendicular to the frontside of the flexible workpiece;
    positioning the resist-coated workpiece with respect to a template so that the resist-coated workpiece is adjacent to the template;
    purging a space between the template and the resist-coated workpiece with a gas;
    evacuating the space between said template and said workpiece; and
    applying a pneumatic pressure to a backside of the flexible workpiece against an etch pattern formed on the transparent window to compensate for variations in a flatness of the flexible workpiece by a flexure of the flexible workpiece to transfer a pattern from said template to a portion of a surface of said resist-coated workpiece;
    wherein said template is configured to flex to conform said surface on a length scale larger than features of said pattern to compensate for variations in a flatness of the workpiece by a flexure of the template, and
    wherein the template is transparent to radiation for exposing a photoresist farmed on said workpiece, thereby allowing said radiation to pass through said template and cure said photoresist.

2. The method of claim 1, further comprising introducing an exposure radiation through said template to a photoresist formed on said workpiece.

3. The method of claim 1, further comprising providing a fixture for laterally confining said template.

4. The method of claim 1, wherein a material of said template is chosen to be transparent to visible wavelengths such that an optical alignment is performable.

5. The method of claim 1, further comprising providing a transparent window over said template, wherein said window is optically perfect.

6. The method of claim 1, wherein said template comprises quartz.

7. The method of claim 5, wherein said window is spaced away from said template to define a gap therein to avoid optical fringes.

8. The method of claim 5, wherein a predetermined gap is formed between a surface of said window opposing a surface of said template, said gap being configured to selectively receive one of a pressurized gas and a vacuum pressure.

9. A method of uniformly applying a pneumatic pressure to a surface of a mask for nano-lithography, said method comprising:
    positioning the mask with respect to a workpiece so that the workpiece is adjacent to the mask;
    purging a space between said mask and the workpiece with a gas;
    evacuating the space between the mask and the workpiece; and
    applying a pneumatic pressure to a backside surface of the mask to uniformly transfer a pattern formed on the mask to a surface of said workpiece formed adjacent to said mask to compensate for variations in a flatness of the workpiece by a flexure of the workpiece,
    wherein said mask is configured to flex to conform to said surface on a length scale larger than features of said pattern, and
    wherein the mask is transparent to radiation for exposing a photoresist formed on said workpiece, thereby allowing said radiation to pass through said mask and cure said photoresist.

10. The method of claim 9, wherein said pneumatic pressure is applied to a back surface of said mask, said back surface of said mask being a surface which is not opposing said surface of said workpiece.

11. The method of claim 9, wherein said method further comprises introducing radiation through the mask to the workpiece.

12. The method of claim 11, further comprising curing, with said radiation, a photoresist formed on said workpiece.

13. The method of claim 9, further comprising:
    reversing the pneumatic pressure applied such that the mask is picked up with a vacuum pressure;
    contacting the mask with the workpiece;
    applying said pneumatic pressure, which comprises a pneumatic pressure, to a back surface of the mask, thereby to transfer the pattern; and
    applying vacuum pressure to remove said mask from said workpiece.

14. The method of claim 9, wherein the evacuating of the space between the mask and the workpiece comprises causing a pressure differential between the space and an exterior of the mask and the workpiece,
    wherein the pressure differential enables the transferring.

15. The method of claim 1, further comprising applying a pneumatic pressure to at least one of a surface of the template and the portion of the surface of the resist-coated workpiece.

16. The method of claim 1, further comprising laterally confining the template and workpiece.

17. The method of claim 1, wherein said gas comprises one of helium and nitrogen.

18. The method of claim 1, wherein said template has a thickness of approximately 50 microns to 500 microns.

19. A method of nano-lithography, said method comprising:
    applying a photoresist to a frontside of a flexible workpiece, the flexible workpiece being held by a flexible seal against a housing structure, and the flexible workpiece having a thickness and comprising a material so as to be flexible in a range of approximately microns in a direction perpendicular to the frontside of the flexible workpiece;

positioning the flexible workpiece with respect to a transparent window, the transparent window being transparent to a radiation necessary to cure the photoresist and to visible wavelengths, so that the flexible workpiece is adjacent to the transparent window;

bringing the flexible workpiece into contact with the transparent window; and applying a pneumatic pressure to a backside of the flexible workpiece against an etch pattern formed on the transparent window to compensate for variations in a flatness of the flexible workpiece by a flexure of the flexible workpiece.

\* \* \* \* \*